United States Patent [19]

Nothnick

[11] Patent Number: 4,952,833
[45] Date of Patent: Aug. 28, 1990

[54] HIGH DENSITY SURFACE ACOUSTIC WAVEGUIDE CHANNELIZER

[75] Inventor: Carl E. Nothnick, Pasadena, Md.

[73] Assignee: Westinghouse Electric Corp., Pittsburgh, Pa.

[21] Appl. No.: 327,443

[22] Filed: Mar. 22, 1989

[51] Int. Cl.$^5$ ............................................. H01L 41/08
[52] U.S. Cl. ............................. 310/313 D; 310/313 C; 333/153; 333/193
[58] Field of Search ............ 310/3 B R, 3 B B, 3 B C, 310/3 B D; 333/150, 151, 153, 193-195; 364/821

[56] References Cited

U.S. PATENT DOCUMENTS

| | | | |
|---|---|---|---|
| 3,406,358 | 10/1968 | Seidel et al. | 333/150 |
| 4,079,342 | 3/1978 | Solie | 310/313 D X |
| 4,181,904 | 1/1980 | Weller et al. | 310/313 D X |
| 4,428,062 | 1/1984 | Michaels | 364/821 |
| 4,499,393 | 2/1985 | Stokes et al. | 310/313 R X |
| 4,633,117 | 12/1986 | Bloch et al. | 310/313 D X |
| 4,697,115 | 9/1987 | Mitsutsuka | 310/313 D X |
| 4,737,743 | 4/1988 | Solie | 333/153 |
| 4,764,701 | 8/1988 | Garbacz et al. | 310/313 D X |
| 4,799,184 | 1/1989 | Grassl | 310/313 R X |

OTHER PUBLICATIONS

Low Cost SAW Convolver with High Spurious Suppression, by P. Dufilie, 1980 *Ultrasonics Symposium*, Boston, MA, U.S.A., Nov. 5-7, 1980, pp. 43-47.

Denis C. Webb, AO, SAW, BAW, and MSW Technology for Frequency Sorting, 1986 IEEE Ultrasonics Symposium at pp. 113 and 114.

Schmidt et al., Thin Film Acoustic Surface Waveguides on Anisotropic Media, IEEE Transactions on Sonics and Ultrasonics, vol. SU-22, No. 2, Mar. 1975.

*Primary Examiner*—Mark O. Budd
*Attorney, Agent, or Firm*—W. G. Sutcliff

[57] ABSTRACT

A surface acoustic wave device is disclosed which performs frequency channelization in a relatively small volume. The invention utilizes a wide band incline step frequency transducer each step feeding an independent beam width compressor waveguide combination. The waveguides fan out with a wide radius of curvature to contain the wave in off pure mode axis propagation. The output of each waveguide then feeds an independent beam width expander and frequency selector interdigital transducer. The use of the waveguides as a tapping and narrow aperture transport mechanism minimizes defraction, allows the output transducers to be widely separated achieving isolation and permits a larger number of filters per substrate.

20 Claims, 3 Drawing Sheets

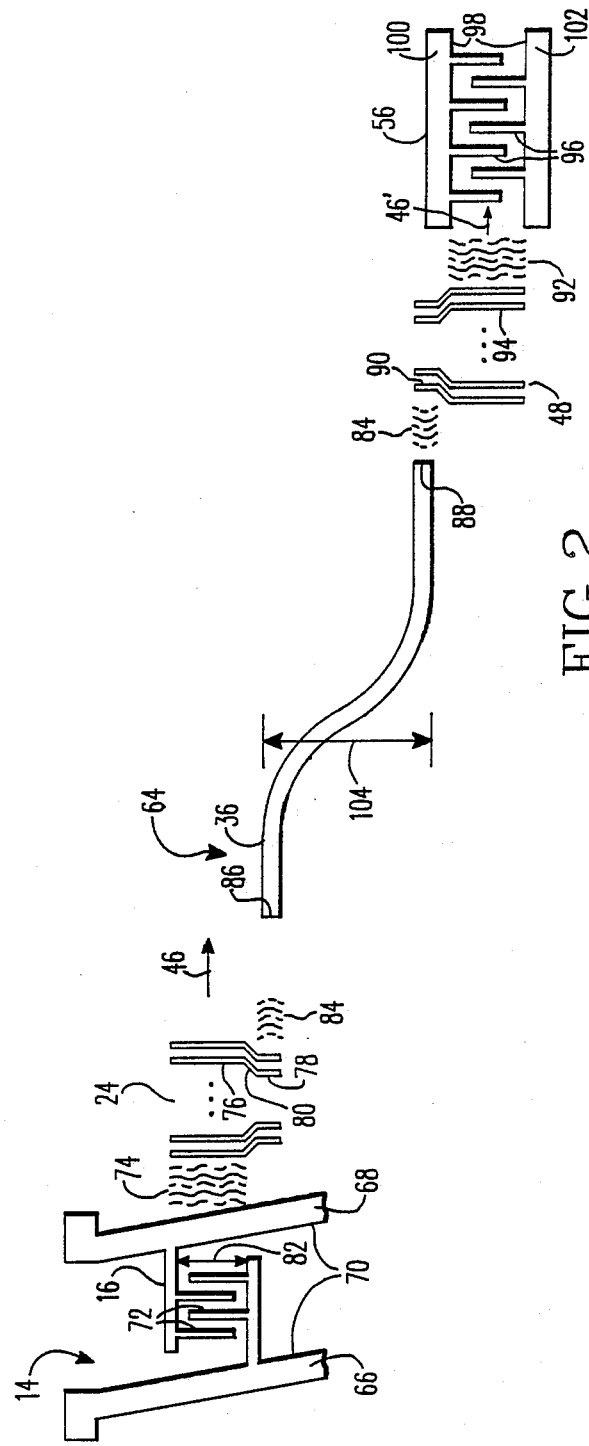
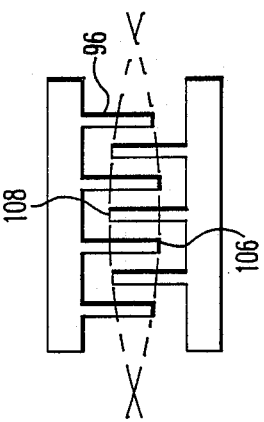
FIG. 2
FIG. 2A

HIGH DENSITY SURFACE ACOUSTIC WAVEGUIDE CHANNELIZER

BACKGROUND OF THE INVENTION:

This invention relates to surface acoustic wave (SAW) devices and, in particular, to high density SAW channelizers having relatively high frequency resolution with minimal cross-talk (high isolation) and high surface utilization.

Signal channelizers provide means for dividing a broad band signal into a plurality of narrow contiguous frequency segments which may be viewed simultaneously. Channelizers are especially useful in RF receivers adapted for electronic warfare. Channelized receivers however suffer from some important deficiencies. Some are excessively large and heavy and consume excessive amounts of power. One of the problems with channelized structures is isolation of the various signals in the incoming RF signal. Cross-talk creates noise problems which can diminish the dynamic range and efficiency of the system. Cross-talk occurs, for example, because acoustic signals propagate in all directions across the surface of the substrate thereby affecting adjacent transducers at the output. This problem has been somewhat alleviated by systems in which a curved input transducer consisting of an array of subtransducers of the same frequency focuses waves at a plurality of output transducers each tuned to a different frequency. The output transducers are selectively located at focal points formed where all the individual contributions add up in phase. However, signal dispersion occurs because the acoustic wave signal propagates in multimode fashion. Electromagnetic noise or interference also occurs because of the close spacing of elements or the substrate.

SUMMARY OF THE INVENTION:

The present invention alleviates and eliminates many of the problems of prior arrangements in a unique combination of elements providing a surface acoustic wave (SAW) channelizer for producing a band limited output signal on each channel. The system comprises an active substrate and metallization elements on the substrate for performing the various functions. The elements include wide band multichannel, frequency stepped, inclined, input interdigital transducer having a plurality of channel transducers each with a relatively wide output aperture for producing a relatively wide aperture beam acoustic wave signal of reduced bandwidth on each channel. A beam width compressor for each channel is responsively coupled to the channel transducer for reducing the acoustic wave signal to a beam of relatively narrow aperture to support a single waveguide mode. A waveguide for each channel has an input aligned with a pure mode axis (PMA) of the substrate and is responsively coupled to the beam width compressor. The waveguide carries the reduced aperture acoustic wave signal there along to its output end which is remote from the channel transducer and from other waveguide outputs in order to better isolate the signals. A beam width expander for each channel is responsively coupled to the output of the corresponding waveguide for expanding the acoustic wave signal to a beam having a relatively larger aperture. A frequency selective interdigital output transducer for each channel is responsively coupled to the expander for producing an electrical RF signal of further reduced bandwidth centered at the corresponding frequency of the stepped input transducer.

In accordance with the present invention, the input and output ends of the waveguides are each preferably located on the substrate so as to be aligned with but on displaced pure mode axes thereof.

In accordance with an embodiment of the present invention the waveguides have a curved portion so that the output transducers may be spread about the substrate at selected locations in order to provide better isolation of the various channels and to more efficiently utilize the available substrate area. The space between the output transducers allows for better transducer/filter design and for better isolation between the various devices. The beam width compressor waveguide combination allows for transport of a narrow aperture signal with minimal diffraction.

In accordance with another embodiment of the present invention selected gap areas may be provided between the transducers for allowing the propagation of stray waves to be isolated from the array of output transducers.

In the present invention the input transducer is relatively small in order to avoid creating waveguide effects as a result of the very high dielectric constant associated with SAW substrates. At the output, however, RF isolation is facilitated by use of RF waveguides which allow the output transducers to be suitably located on the substrate so that the acoustic wave signals are temporarily correct while the transducers are shifted or displaced on the pure mode axes of the substrate.

BRIEF DESCRIPTION OF THE DRAWINGS:

FIG. 2 is a schematic diagram of one channel of the surface acoustic waveguide channelizer illustrated in FIG. 1 in greater detail;

FIG. 2A is a detail of an exemplary interdigital transducer configuration;

Figure 1:
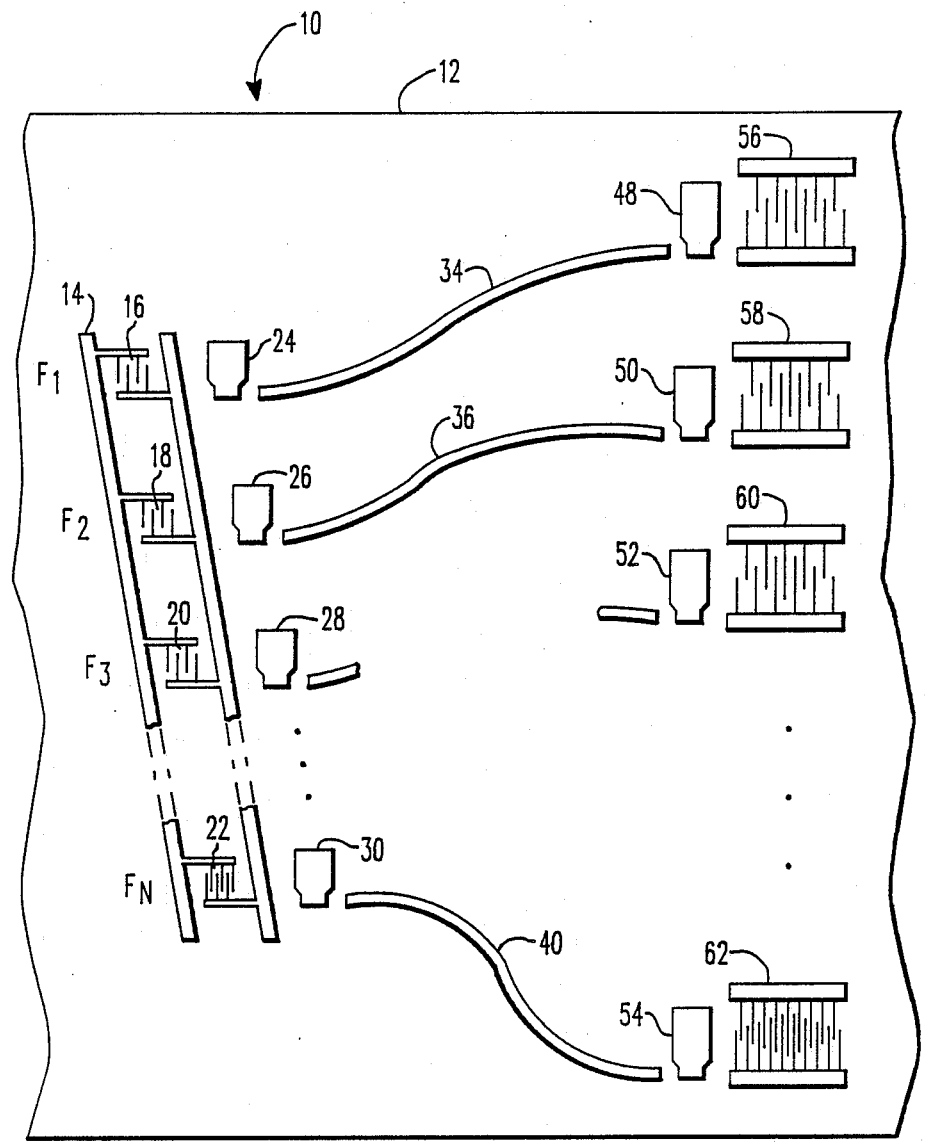
FIG. 1 is a schematic diagram of a high density surface acoustic wave channelizer in accordance with the present invention illustrating an input transducer with a plurality of channels and corresponding output transducers.

DESCRIPTION OF THE PREFERRED EMBODIMENT:

A surface acoustic wave channelizer 10 according to the present invention which performs signal sorting by frequency channelization in a relatively small volume is illustrated in FIG. 1. The invention utilizes a surface acoustic wave substrate 12 having metallized elements thereon. A wide band, inclined, step frequency, multichannel input transducer 14 is provided which has a plurality of individual channel transducers 16-22 responsive to different bandwidths of channel frequencies centered about $F_1$-$F_n$, respectively. Each channel transducer 16-22 feeds a respective independent beam width compressor 24-30 and waveguide 34-42. The waveguides 34-40 are located on the substrate 12 in a fanned out arrangement as illustrated, each waveguide having a relatively wide radius of curvature $R_c$ so as to contain the wave or signal within the waveguide. As should be readily apparent to those skilled in the art the most efficient propagation of acoustic waves is along the pure mode axis 46 which is associated with the crystal structure of the substrate 12. The acoustic wave signal is propagated on the substrate at a free space velocity $V_s$ and propagation under the waveguide at a reduced velocity $V_w$. If the radius of curvature is $R_c$ of a waveguide is greater than about 200 wave lengths, a wave entering the waveguide on the pure mode axis (PMA) at less than the critical angle will be totally internally reflected. Thus, the waveguide is able to displace the acoustic wave from the pure mode axis 46 at one location (i.e. the input) to a parallel (PMA) 46' at the output.

In accordance with the invention because the waveguides 34-40 allow the acoustic wave to be displaced off the pure mode axis 46, the circuit designer has allowed greater design freedom. The waveguides 34-40 in allowing for lateral displacement of the signal with respect to the pure mode axis 46 allows for more effective and efficient use of the substrate 12. This occurs because the input transducer 14 and the output transducers 56-62 can be sized and located for best utilization as hereafter described.

Referring to FIG. 1 again, the waveguides 34-40 fan out with a wide radius of curvature $R_c$ in order to contain the wave or the axis of propagation. The output of each waveguide 34-40 feeds an independent beam width expander 48-54 for each channel and the corresponding frequency selective interdigital output transducer 56-62.

In accordance with the present invention one channel 64 of the apparatus 10 in FIG. 1 is illustrated in greater detail in FIG. 2. The input transducer 14 is comprised of a pair of RF input leads 66 and 68 which are coupled to external circuitry (not shown) and energized by an RF signal 70 which has a relatively wide bandwidth. The transducer 16 (as well as the transducers 18-22 illustrated in FIG. 1 have interdigital fingers 72 which are transverse to the pure mode axis 46 illustrated by the arrow. The RF signal 70 causes an electric field to be established between the interdigital fingers 72 causing displacement of the crystal structure of the substrate 12 to thereby convert the RF signal 70 into an acoustic wave signal 74. The beam width compressor 24 has a wide aperture portion 76 which is about 40 wavelengths long and a narrow aperture portion 78 which is about 3 wavelengths long. The wide aperture 76 and the narrow aperture 78 are connected by a transition portion 80 which is inclined with respect to the pure mode axis 46 and is a relatively inefficient acoustic wave transmitter. Thus, acoustic energy is transferred to the narrow aperture 78. The channel transducer 16 has an aperture 82 which corresponds to the wide aperture 76 of the beam width compressor 24. When the acoustic wave signal 74 enters the beam width compressor 24 the mode of propagation is compressed or transferred from the wide aperture portion 76 to the narrow aperture portion 78 whereby a relatively narrow aperture, preferably single mode, acoustic wave signal 84 is produced for insertion into the waveguide 36. The input end 86 of the waveguide 36 is acoustically coupled to the narrow aperture 78 of the beam width compressor 24 along a pure mode axis 46 and thus receives the acoustic wave signal 84. The signal 84 is carried by the waveguide 36 from the input 86 to the output 88 where it exits and enters a narrow aperture portion 90 of the beam width expander 48. The narrow aperture acoustic wave signal 84 is converted into a wide aperture acoustic wave signal 92 by the expander 48 in the wide aperture portion 94 thereof. The wide aperture acoustic wave signal 92 is coupled to the output transducer 56 also formed of a number of interdigital fingers 96 which have a higher frequency selectivity than the input transducer 16. The output transducer 56 of the channel 64 is centered at frequency $F_1$ and has a narrower bandwidth than the input channel transducer 16 also centered at frequency $F_1$. The output acoustic wave signal 92 is propagated along a pure mode axis 46' displaced by the relative displacement 104 of the input 86 of the waveguide 36 with respect to the output 88. An RF output signal 98 is produced on the leads 100 and 102 of the output transducer 56.

The interdigital fingers 96 of the output transducer 56 may be overlapped as shown in FIG. 2 in a uniform manner with each of the interdigital fingers 96 having an equal weight. Alternatively, the fingers 96 may be overlapped in a manner illustrated in FIG. 2A such that the ends 106 of one group of fingers 96 overlap the end 108 in a gaussian fashion. In other words the centrally located fingers 96 are overlapped to a greater degree than the marginal fingers as shown in FIG. 2A for a more smooth coupling of the acoustic wave signals to the transducer. The fingers are typically separated by one-half wavelength. Also, alternate multiple parts of fingers separated by a quarter wavelength may be provided.

Figure 3:
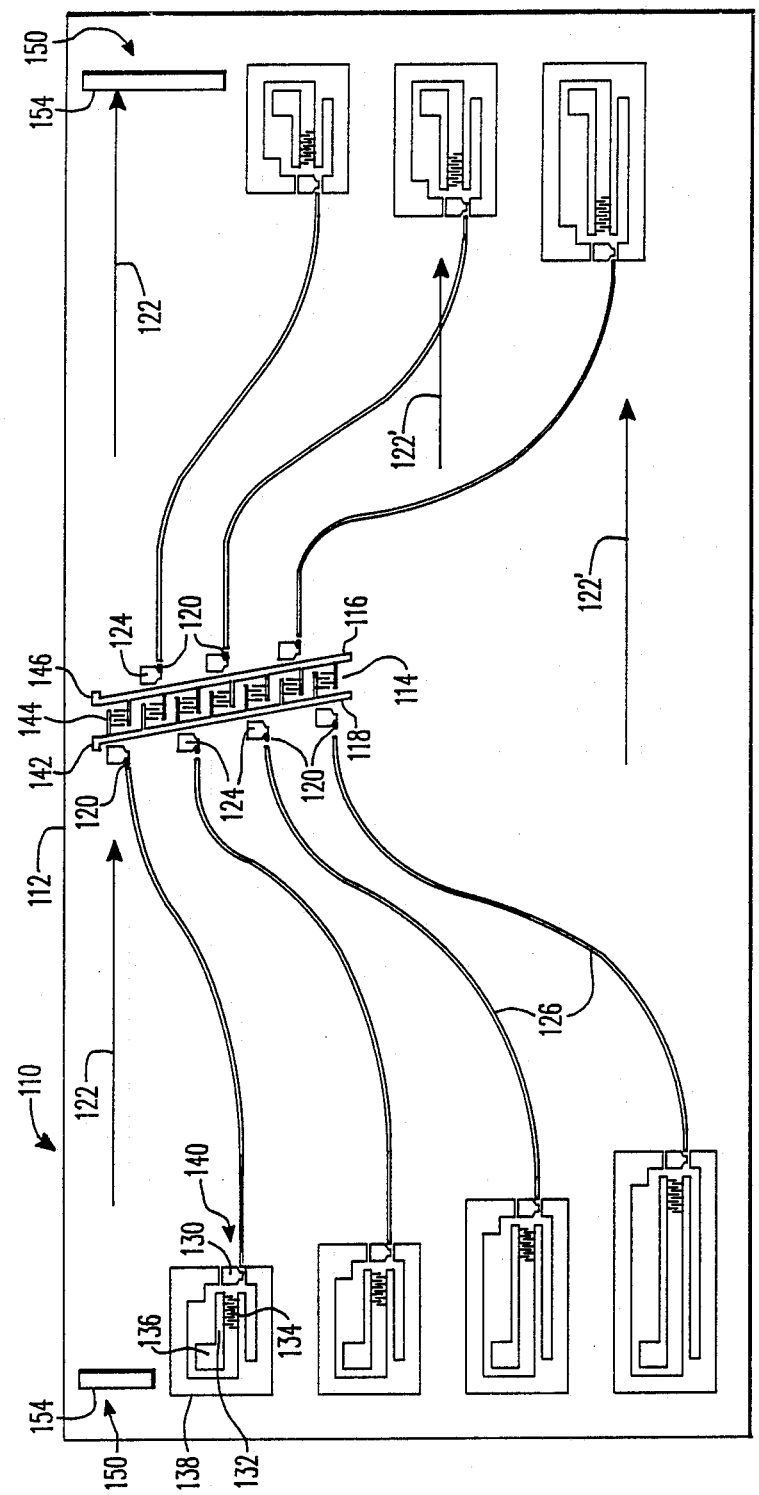
FIG. 3 is a schematic diagram of a surface acoustic wave channelizer in which channels are located on either side of the input transducer and spread over the surface of the substrate.

FIG. 3 illustrates an acoustic wave channelizer 110 in accordance with another embodiment of the invention in which a substrate 112 carries an inclined input transducer 114 which has a pair of outputs 116 and 118 as illustrated. In FIG. 3 the input transducer 114 produces acoustic wave signals 120 in opposite directions along the pure mode axis 122. The beam width compressors 124 and the waveguides 126 carry the acoustic wave signals 120 off the pure mode axis 122 to parallel displaced pure mode axes 122' to the various output transducers 128 via the beam width expanders 130. The length of each waveguide 126 is selected so that the acoustic wave signal carried thereby arrives at the respective output transducer 128 at the same time and the same phase as all the other acoustic wave signals simultaneously launched by the input transducer 114. Such a temporal arrangement can be calculated by appropriate algorithms which are not discussed herein but which are known in the art. The output transducers 128 receive the acoustic wave signals 120 along the displaced pure mode axis 122' in accordance with the curvature of the waveguide as shown.

Each output transducer 128 includes a pair of RF waveguide leads 132 and interdigital fingers 134. The number and arrangement of the fingers 134, for example, equal or gaussian weighting is selected in order to provide appropriate selectivity for the particular transducer. The leads 132 extend from the fingers 134 to a contact pad 136 and a ground plane 138 as shown. Appropriate output leads not shown are coupled to the pad 136 and ground plane 138 in a manner known in the art. The ground plane 138 surrounds the leads 132 and the fingers 134 as shown. A small aperture 140 in the ground plane is provided to allow the waveguide 126 to be acoustically coupled to the beam width expander 130 as illustrated.

In accordance with the present invention the input transducer 114 covers a relatively small portion of the substrate 112. Further, the terminals or leads 142 of the input transducer are inclined so as to minimize reflected effects of the metal discontinuity in the propagation path. Further, each of the individual channel transducers 144 in the transducer 114 are driven simultaneously from an RF source via the leads 142 and the pads 146. The bandwidth of each frequency step transducer or channel transducer 144 is controlled through the number of finger pairs, the withdrawal weighting, i.e. the overlap and apodization. The input transducer 144 thus acts as a first frequency sorting device. The aperture of each transducer is relatively small, approximately 10 wave lengths, keeping the overall length rather short. The beam width compressor 124 as noted above decreases the aperture of the acoustic wave about 70% from about 10 wave lengths to 3 wave lengths to support a single mode waveguide propagation. On the output end of the waveguides 126 the beam width expanders 130 increase the aperture from about 3 wave lengths to about 40 wave lengths, of about an order of magnitude. The output transducers 128 are appropriately sized to have the wide apertures which allows for more room to control the overlap or weighting of the fingers to thereby establish greater frequency selectivity or selective band pass filtering. Because the aperture of the output transducer is relatively large, diffraction effects are significantly reduced thereby allowing for better filter performance. This is in direct contrast to prior art devices which have narrow apertures which make bragg focusing and filter design difficult.

Fanning out of the output transducers 128 by means of the curved waveguides 126 also allows for greater spacing between output transducers and hence better RF isolation. It should be noted that the leads 132 act as an RF or electromagnetic waveguide (coplanar) to the pad 136 and ground plane 138.

It should be understood that in accordance with the present invention a gap region 150 may be provided on the substrate 112. The gap region 150 is directly opposite the input transducer on the pure mode axis 122 and may be the site for stray acoustic waves 152 which travel directly along the pure mode axis 122 as shown. In accordance with the invention the output transducer 128 are preferably located out of the gap region 150 in order to prevent interference. Also an absorber 154 may be located in the gap region 150 for absorbing stray acoustic waves 152.

Figure 3A:
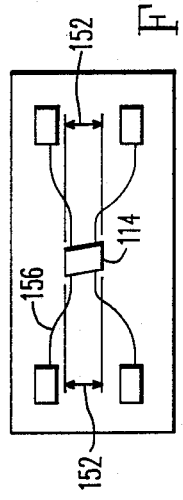
FIG. 3A is an alternate embodiment of the arrangement illustrated in FIG. 3.

FIG. 3A illustrates another embodiment of the invention in which the gap region 152 is directly opposite the input transducer 114 and the channels 156 are located on opposite sides of the gap 152 as illustrated.

Typical SAW devices may operate from about 10 to 1500 megahertz range with resolutions from about 100 kilohertz to 100 megahertz bandwidth with present state of the art photolithography techniques. The embodiment of the present invention is designed to specifically operate with an RF input bandwidth of about between 200 and 1000 megahertz. Each input interdigital transducer has a bandwidth of about 2 to 3 times that of the corresponding output transducer. In other words the output transducers have a narrow bandwidth and are more selective. Further, the output transducers have a center to center bandwidth of about between 10 and 30 megahertz. In the present invention channel densities of as much as 50 per 0.5" by 0.5" substrate area are achievable.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed:

1. A surface acoustic wave (SAW) channelizer for producing a band limited output signal on each channel comprising: an active substrate and metallization elements on the substrate including a wide band, multichannel, frequency stepped, input interdigital transducer having a plurality of input channel transducers, each having a different center frequency and having a relatively wide output aperture for producing a corresponding relatively wide aperture beam frequency stepped acoustic wave signal of reduced bandwidth on each corresponding channel;

a beam width compressor for each channel responsively coupled proximate to the input transducer for reducing the acoustic wave signal to a beam width of relatively narrower aperture;

a waveguide for each channel having an input responsively coupled proximate to the beam width compressor for such channel, said waveguide for isolating and carrying the acoustic wave signal therealong to its output end, the input and output ends of each waveguide being remote from and laterally displaced with respect to each other and separated from the other waveguide outputs by an amount sufficient to reduce cross talk between channels;

a beam width expander for each channel responsively coupled proximate to the output of the corresponding waveguide output for expanding the acoustic wave signal to a beam of relatively larger aperture;

a frequency selective, interdigital output transducer for each channel responsively coupled proximate to the waveguide output for producing an RF electrical signal of further reduced bandwidth centered at the frequency of the corresponding frequency stepped channel input transducer.

2. The channelizer of claim 1 wherein the beam width compressor compresses the acoustic wave signal to about an aperture which corresponds to a single mode of acoustic wave transmission.

3. The channelizer of claim 2 wherein the beam width compressor reduces the aperture of the acoustic wave signal by about 70%.

4. The channelizer of claim 1 wherein the substrate has a pure mode axis for propagation of acoustic wave signals and the waveguide receives the acoustic wave signal along a pure mode axis and delivers the signal at its output along a pure mode axis parallel to and displaced from the input.

5. The channelizer of claim 4 wherein the waveguide has a curved portion for displacing the input from the output to different pure mode axis.

6. The channelizer of claim 5 wherein the radius of curvature of the waveguide is greater than about 200 wavelengths of the input signal.

7. The channelizer of claim 5 wherein each waveguide has a length such that the acoustic wave signal carried thereby travels from the input to the output in the same amount of time as other simultaneous launched acoustic wave signals of the other channels.

8. The channelizer of claim 1 wherein the beam width expander expands the acoustic wave signal at the output of the waveguide by about an order of magnitude.

9. The channelizer of claim 1 wherein the output transducers are physically separated from each other by a distance sufficient to limit RF interference therebetween.

10. The channelizer of claim 1 wherein each output interdigital transducer includes an RF waveguide, an output pad and a ground plane surrounding the transducer.

11. The channelizer of claim 1 wherein the ground plane has an aperture along the pure mode axis for receiving the expanded acoustic wave signal from the beam width expander.

12. The channelizer of claim 1 wherein the interdigital input transducer is disposed at an angle relative to a pure mode axis of the substrate for minimizing interference between the acoustic wave signal generated by the transducer and the metallized proportions thereof.

13. The channelizer of claim 1 wherein a portion of the substrate aligned with the input interdigital transducer along a pure mode axis of the substrate is reserved for stray acoustic wave signals.

14. The channelizer of claim 13 further including an acoustic wave absorber disposed across the pure mode axis in the reserved area for absorbing stray acoustic wave signals propagating therealong.

15. The channelizer of claim 14 wherein the absorber is a room temperature vulcanizing absorber.

16. The channelizer of claim 1 wherein the substrate is lithium nobiate and the metallized components are formed of aluminum deposited thereon to a thickness of about between 1000 and 1500 angstroms and bonding pads for the metallizing components are formed of gold.

17. The channelizer of claim 1 wherein the input RF signal has a bandwidth of about 200 to 1000 megahertz and the input interdigital transducer produces channels each having a bandwidth of 2 to 3 times the output transducer megahertz.

18. The channelizer of claim 17 wherein the output transducers produce a signal centered at the frequency of the channel and have a bandwidth of about 10 to 30 megahertz.

19. The channelizer of claim 18 wherein the channels overlap in adjacent bandwidths at about 3 DB.

20. The channelizer of claim 1 wherein the density of channels is 50 channels per 0.5" by 0.5" area of the substrate.

* * * * *